US010869402B2

(12) United States Patent
Triplett

(10) Patent No.: US 10,869,402 B2
(45) Date of Patent: *Dec. 15, 2020

(54) EXPANSION MODULE SYSTEM

(71) Applicant: Honeywell International Inc., Morris Plains, NJ (US)

(72) Inventor: Jim Triplett, Midlothian, VA (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/705,827

(22) Filed: Dec. 6, 2019

(65) Prior Publication Data

US 2020/0113079 A1     Apr. 9, 2020

Related U.S. Application Data

(63) Continuation of application No. 16/372,820, filed on Apr. 2, 2019, now Pat. No. 10,568,227, which is a
(Continued)

(51) Int. Cl.
*G06F 13/42* (2006.01)
*G06F 13/40* (2006.01)
(Continued)

(52) U.S. Cl.
CPC ......... *H05K 7/026* (2013.01); *G05B 19/0423* (2013.01); *G06F 13/4256* (2013.01);
(Continued)

(58) Field of Classification Search
CPC ........................ G06F 13/4045; G06F 13/4247
See application file for complete search history.

(56) References Cited

U.S. PATENT DOCUMENTS 7,028,126 B1    4/2006  Liang
7,305,535 B2   12/2007  Harari et al.
(Continued)

FOREIGN PATENT DOCUMENTS

EP        1096359 A2    5/2001

OTHER PUBLICATIONS

U.S. Appl. No. 14/673,705, filed Mar. 30, 2015.
(Continued)

*Primary Examiner* — Zachary K Huson
(74) *Attorney, Agent, or Firm* — Seager, Tufte & Wickhem LLP

(57) ABSTRACT

A system and approach that may connect communication modules together in a daisy chain fashion as an expansion bus. A communication module may be connected with a data bus and a voltage bus to a baseboard having a controller. The communication module may have a multi-port universal serial bus hub connected to the data bus from the expansion connector, an electronic device connected to the hub and the voltage regulator. Another communication module having a similar structure as the first communication module may be connected to the first communication module via a data bus between the multiport hub of the first expansion module and a universal serial bus hub of the other communication module, and may have a voltage bus connected to the voltage bus of the first communication module. More communication modules may be connected in a daisy chain or serial fashion to a preceding module, and so on.

20 Claims, 3 Drawing Sheets

Related U.S. Application Data continuation of application No. 14/673,742, filed on Mar. 30, 2015, now Pat. No. 10,292,292.

(51) Int. Cl.
*H05K 7/02* (2006.01)
*H05K 7/14* (2006.01)
*G05B 19/042* (2006.01)
*H04L 12/64* (2006.01)

(52) U.S. Cl.
CPC ....... *H04L 12/6418* (2013.01); *H05K 7/1477* (2013.01); *G05B 2219/21039* (2013.01); *G06F 13/4045* (2013.01); *G06F 13/4247* (2013.01)

(56) References Cited

U.S. PATENT DOCUMENTS

| | | | |
|---|---|---|---|
| 7,706,136 | B1 | 4/2010 | Dotson et al. |
| 8,966,136 | B2 | 2/2015 | Sip |
| 10,292,292 | B2 * | 5/2019 | Triplett .................. H01R 43/16 |
| 2003/0135681 | A1 | 7/2003 | Laity et al. |
| 2005/0086413 | A1 | 4/2005 | Lee et al. |
| 2010/0205463 | A1 | 8/2010 | Magnusson |
| 2016/0295732 | A1 | 10/2016 | Triplett |

OTHER PUBLICATIONS

U.S. Appl. No. 14/673,779, filed Mar. 30, 2015.
Distech Controls, "Eclypse Connected System Controller Data Sheet," 12 pages, 2014.
Distech Controls, "It's Time You Experienced Eclypse," 16 pages, 2014.
Wikipedia, "Pearson Hashing," 4 pages, downloaded Mar. 26, 2015.
International Search Report and Written Opinion for Corresponding Application No. PCT/US2016/024721, dated Jul. 12, 2016.

* cited by examiner

EXPANSION MODULE SYSTEM

This application is a Continuation of U.S. patent application Ser. No. 16/372,820, filed Apr. 2, 2019, which is a Continuation of U.S. patent application Ser. No. 14/673,742, filed Mar. 30, 2015. U.S. patent application Ser. No. 14/673,742, filed Mar. 30, 2015, is hereby incorporated by reference. U.S. patent application Ser. No. 16/372,820, filed Apr. 2, 2019, is hereby incorporated by reference.

BACKGROUND

The present disclosure pertains to communications and particularly to groups of communication modules.

SUMMARY

The disclosure reveals a system and approach that may connect communication modules together in a daisy chain fashion as an expansion bus. The present system may be a part of a building automation or management system. An expansion module may be connected with a data bus to an expansion connector on a baseboard having a controller. Also, the expansion module may be connected to a voltage or power source via a pre-regulated voltage bus. The expansion module may have a multi-port universal serial bus hub connected to the data bus from the expansion connector, an electronic device connected to the hub and the voltage regulator. Another expansion module having a similar structure as the first expansion module may be connected to the first expansion module via a data bus between the multiport hub of the first expansion module and a hub of the other expansion module, and may have a pre-regulated voltage bus connected to the voltage or power bus of the first expansion module. More expansion modules may be connected in a daisy chain or serial fashion to a preceding module, and so on in a similar manner.

DESCRIPTION

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

In the building automation controller, daisy chain expansion modules with specific functionality may provide a way to easily add on a variety of communication modules. Communication or expansion modules may be connected to a main processor via a parallel bus which requires many I/O lines and thus a large connector. The present approach may utilize a universal serial bus (USB) which provides a high speed connection, low pin count, and ease of expansion. To accommodate multiple modules, one may run a dedicated USB pair for each module. A USB hub may be added to each module.

The benefits of the present approach may incorporate no USB hub needed on a base board, fewer connections required in the board to a board interconnect, and an improved signal integrity because each hub restores the signal and each signal on it passes through one connector pair.

A four port USB hub (e.g., USB2514BI-AEZG) may be used on each module. The hub input may come from a previous module. One hub output may go to an on module USB device (e.g., Atmel ATSAM4S16BA) and additional devices can be added if desired or needed. One hub output may exit the module and be passed to the next module in the line.

Figure 1:
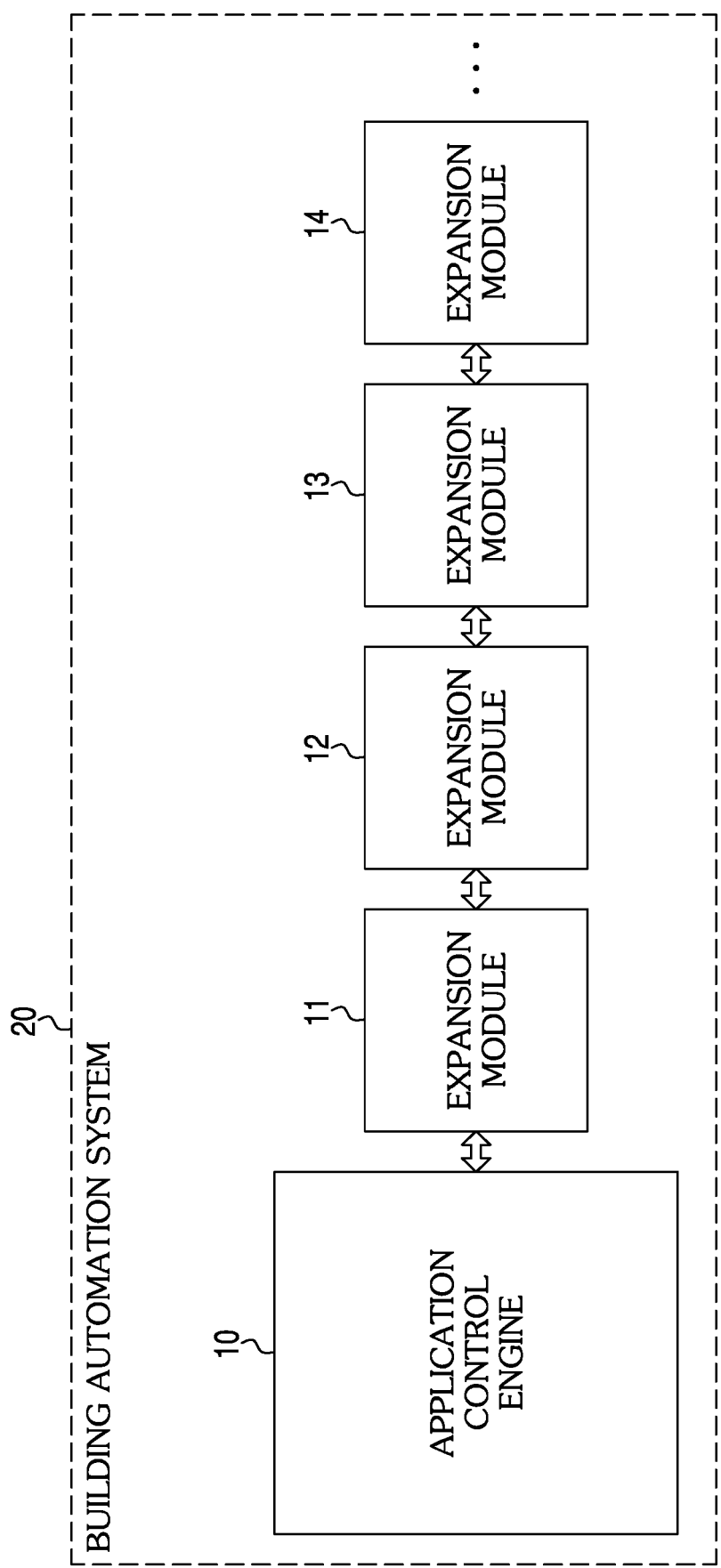
FIG. 1 is a diagram of a basic daisy chain expansion bus system.

FIG. 1 is a diagram of the present system. The system may be a part of a building automation or management system 20. Block 10 may represent an application control engine (ACE) such as a Tridium™ JACE-8000™ Java™ application control engine (JACE™). Blocks 11, 12, 13 and 14 may indicate communication or expansion modules. There may be more or less than the four expansion modules shown.

Figure 2:
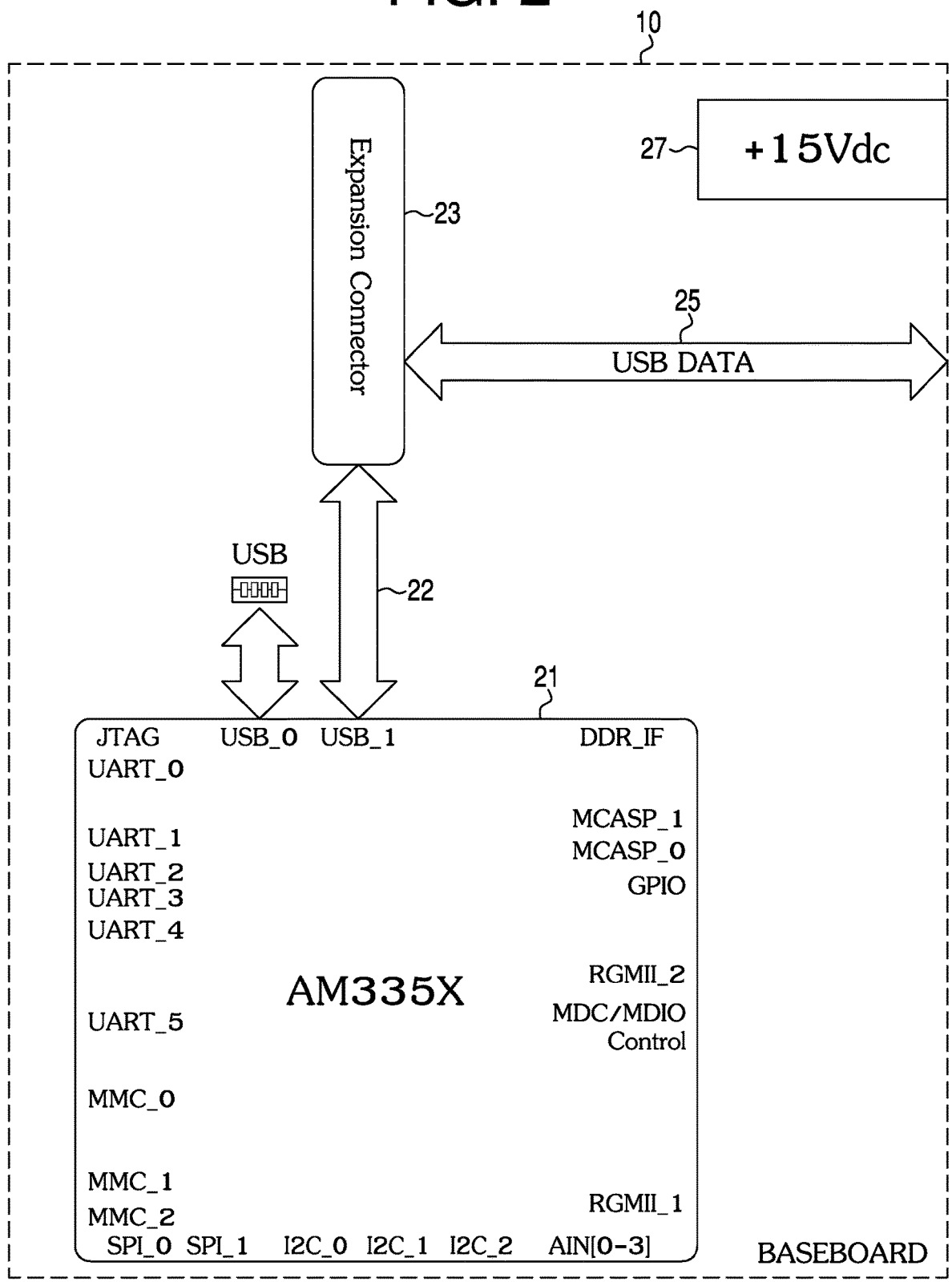
FIG. 2 is a diagram of a baseboard of the daisy chain expansion bus expansion bus system.

FIG. 2 is a diagram that reveals more details of a baseboard or block 10. It may incorporate a Titan™ JACE that has processor 21 with a USB connection 22 to an expansion connector 23. Processor 21 may, for example, be a TI™ AM335X processor available from Texas Instruments Inc. A DC power source 27 may also be available.

Figure 3:
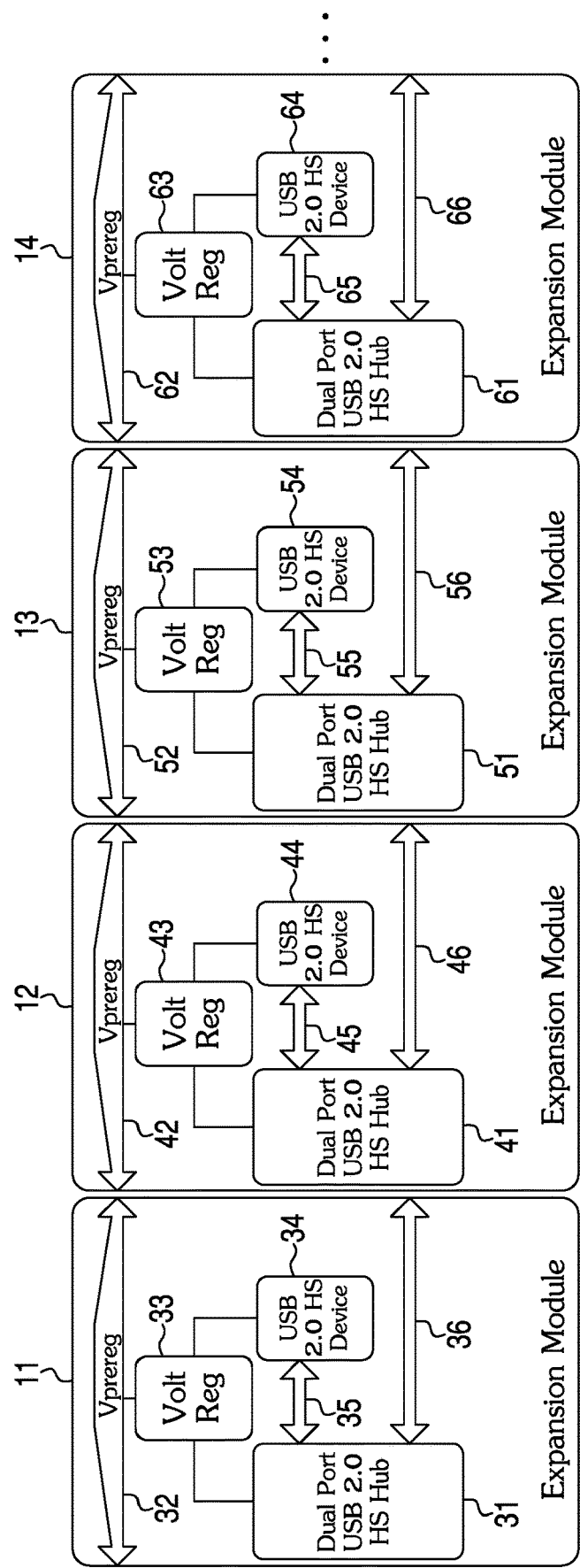
FIG. 3 is a diagram of the several expansion modules of the daisy chain expansion system.

Expansion connector 23 as an output (JACE side) expansion connector may be a Hirose™ FX18-40P-0.8SH. Hirose FX18-40P-0.8SH may be the output (next module) expansion connector. In FIG. 2, expansion connector 23 may have a USB data connection 25 to a multi-port hub such as a dual port hub 31 of expansion module 11 in FIG. 3. An input connector on each expansion module may be a Hirose FX18-40S-0.85SH. DC power source 27 at baseboard 10 may be connected to a pre-regulated voltage bus 32. A voltage regulator 33 may have an input connected to bus 32. A regulated voltage output may be provided by regulator 33 to hub 31 and to a USB device 34. A USB data connection 35 may be between hub 31 and device 34. No USB hub is necessarily needed on baseboard 10 since USB signals come directly from processor 21.

A USB data connection 36 may go from a hub 31 of expansion module 11 to a multi-port hub such as a dual port hub 41 of expansion module 12. A pre-regulated voltage bus 42 may be connected to voltage bus 32 of expansion module 11. A voltage regulator 43 of expansion module 12 may have an input connected to bus 42. A regulated voltage output may be provided by regulator 43 to hub 41 and to a USB device 44. A USB data connection 45 may be between hub 41 and device 44.

A USB data connection 46 may go from hub 41 of expansion module 12 to a multi-port hub such as a dual port hub 51 of expansion module 13. A pre-regulated voltage bus 52 may be connected to voltage bus 42 of expansion module 12. A voltage regulator 53 of expansion module 13 may have an input connected to bus 52. A regulated voltage output may be provided by regulator 53 to hub 51 and to a USB device 54. A USB digital connection 55 may be between hub 51 and device 54.

A USB data connection 56 may go from hub 51 of expansion module 13 to a multi-port hub such as a dual port hub 61 of expansion module 14. A pre-regulated voltage bus 62 may be connected to voltage bus 52 of expansion module 13. A voltage regulator 63 of expansion module 14 may have an input connected to bus 62. A regulated voltage output may be provided by regulator 63 to hub 61 and to a USB device 64. A USB digital connection may between hub 61 and device 64. Device or devices 64 may consist of electronic circuits having various functionalities. There may be one or more devices 64 in each expansion module. In a situation where there may be several devices 64 in one expansion module, the devices can have different functionalities. The present description of device or devices 64 may also be applicable to devices 34, 44 and 54.

A USB data connection 66 may go from hub 61 of expansion module 14 to still another expansion module in the same manner as expansion modules 12, 13 and 14 were added to preceding modules 11, 12 and 13, respectively.

A high speed USB signal may be buffered and resent at each expansion module and pass through only one set of connectors thereby improving signal integrity over that of other multiple expansion module configurations. There may be a decreased pinout in the expansion connector because just a single USB signal needs to pass through.

To recap, a module system may incorporate a baseboard, a first expansion module connected to the baseboard, a second expansion module connected to the first expansion module, and one or more additional expansion modules. The baseboard may incorporate a controller, and an expansion connector connected to the controller. The first expansion module may incorporate a universal serial bus (USB) device, and a multi-port hub having a first port connected to the expansion connector, a second port connected to the USB device, and a third port connected to the second expansion module. The one or more additional expansion modules may be connected in a daisy chain to the second expansion module in a manner that the second expansion module is connected to the first expansion module. Each expansion module of the one or more expansion modules may incorporate a voltage regulator having an input connected to a voltage supply line, and an output connected to a multi-port hub and to a USB device respectively of each expansion module.

The first expansion module may incorporate a voltage regulator having an input connected to a voltage supply line that is connected to a voltage source at the baseboard, and an output connected to the multi-port hub and the USB device.

The controller may provide a USB signal via the expansion connector to the multiport hub of the first expansion module.

The USB signal may be buffered and resent at each expansion module through one set of connectors to virtually maintain an integrity of the USB signal.

The expansion connector may have a minimal pinout since just a single USB signal needs to pass through the expansion connector.

The USB device may incorporate a microcontroller. The microcontroller may process a signal from the multi-port USB hub and provide a processed signal to the multi-port USB hub.

Each USB device of the first expansion module, of the second expansion module, and of the one or more additional expansion modules may be selected from a group consisting of microprocessors, converters, amplifiers, databases, and memories.

One or more of the first expansion module, the second expansion module, and the one or more additional expansion modules may incorporate one or more additional USB devices. Each of the one or more additional USB devices may be selected from a group consisting of microprocessors, converters, amplifiers, databases, and memories.

An approach for connecting expansion modules, may incorporate connecting a first expansion module to a baseboard, and connecting a second expansion module to the first expansion module. The baseboard may incorporate a microcontroller, and an expansion connector connected to the microcontroller. The first expansion module may incorporate a universal serial bus (USB) device, and a multi-port hub having a first port connected to the expansion connector, a second port connected to the USB device, and a third port connected to the second expansion module.

The second expansion module may incorporate a USB device, and a multi-port hub having a first port connected to the third port of the multi-port hub of the first expansion module, a second port connected to the USB device, and a third port connected to the third expansion module.

The approach may further incorporate connecting a third expansion module to the second expansion module in a manner that the second expansion module is connected to the first expansion module.

USB devices of the first, second, and third expansion modules may be selected from a group consisting of microprocessors, converters, amplifiers, databases, and memories.

The approach may further incorporate connecting the hub and USB device of the first expansion module to a voltage bus, connecting the hub and USB device of the second expansion bus to a voltage bus, connecting the hub and USB device of the third expansion bus to a voltage bus, connecting the voltage bus of the first expansion module to a voltage supply at the baseboard, connecting the voltage bus of the second expansion module to the voltage bus of the first expansion module, and connecting the voltage bus of the third expansion module to the voltage bus of the second expansion module.

The approach may further incorporate connecting a third expansion module of one or more of N additional expansion modules to the second expansion module, a N–2 expansion module of the additional expansion modules to the third expansion module, an N–3 expansion module of the additional expansion modules to the N–2 expansion module, an N–4 expansion module of the additional expansion modules to the N–3 expansion module, and so on in a daisy chain fashion through connecting an N–(N–1) expansion module to an N–(N–2) expansion module, in a manner that the second expansion module is connected to the first expansion module.

An expansion bus mechanism may incorporate a baseboard having a microcontroller and an expansion connector connected to the controller, and a daisy chain of a number (N) of expansion modules having a first expansion module connected to the expansion connector.

Each expansion module of the N expansion modules may incorporate a multi-port hub, and one or more devices connected to the multi-port hub. Each of the second through N expansion modules may have a first port of its multiport hub connected to a preceding expansion module and a second port connected to a first port of a succeeding expansion module. A preceding expansion module may be an n–1 expansion module and a succeeding expansion module may be an n+1 expansion module of an n module. An n module may be any module selected from the second through N–1 expansion modules. The Nth expansion module may have a preceding (N–1) expansion module.

The multi-port hub of each of the N expansion modules may have a third port connected to a device.

One or more devices may be selected from a group consisting of microprocessors, converters, amplifiers, databases, and memories.

Each expansion module may further incorporate a voltage regulator having an output connected to the multi-port hub and to one or more devices.

The multi-port hub may be a universal serial bus (USB) hub. The one or more devices may be USB devices.

The voltage regulator of an expansion module may be connected to a voltage line. The voltage line of an expansion module may be connected to a voltage line of a preceding expansion module. The voltage line of the first expansion module may be connected to a voltage supply.

Any publication or patent document noted herein is hereby incorporated by reference to the same extent as if each individual publication or patent document was specifically and individually indicated to be incorporated by reference.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A module system comprising:
   a baseboard;
   a first expansion module connected to the baseboard;
   a second expansion module connected to the first expansion module; and
   one or more additional expansion modules; and
   wherein:
   the baseboard comprises:
     a power source;
     a controller;
     an expansion connector connected to the controller; and
     is free of a USB hub; and
   the first expansion module comprises:
     a universal serial bus (USB) device; and
     a multi-port hub having a first port connected to the expansion connector, a second port connected to the USB device, and a third port connected to the second expansion module;
   the one or more additional expansion modules are connected in a daisy chain to the second expansion module in a manner that the second expansion module is connected to the first expansion module; and
   each expansion module of the one or more additional expansion modules comprises a voltage regulator having an input connected to a voltage supply line, and an output connected to a multi-port hub and to a USB device respectively of that expansion module.

2. The module system of claim 1, wherein the voltage supply line of the first expansion module is connected to the power source of the baseboard.

3. The module system of claim 1, wherein the controller provides a USB signal via the expansion connector to the multi-port hub of the first expansion module.

4. The module system of claim 3, wherein the USB signal is buffered and resent at each expansion module through one set of connectors to virtually maintain an integrity of the USB signal.

5. The module system of claim 3, wherein the expansion connector has a minimal pinout since just a single USB signal needs to pass through the expansion connector.

6. The module system of claim 1, wherein:
   the USB device comprises a microcontroller; and
   the microcontroller processes a signal from the multi-port hub and provides a processed signal to the multi-port hub.

7. The module system of claim 6, wherein each USB device of the first expansion module, of the second expansion module, and of the one or more additional expansion modules, is selected from a group consisting of microprocessors, converters, amplifiers, databases, and memories.

8. The module system of claim 6, wherein one or more of the first expansion module, the second expansion module, and the one or more additional expansion modules comprise one or more additional USB devices.

9. The module system of claim 8, wherein each of the one or more additional USB devices is selected from a group consisting of microprocessors, converters, amplifiers, databases, and memories.

10. A method for connecting expansion modules, comprising:
    connecting a first expansion module to a baseboard; and
    connecting a second expansion module to the first expansion module; and
    wherein:
    the baseboard comprises:
      a power source;
      a microcontroller;
      an expansion connector connected to the microcontroller; and
      is free of a USB hub; and
    the first expansion module comprises:
      a voltage bus;
      a universal serial bus (USB) device; and
      a multi-port hub having a first port connected to the expansion connector, a second port connected to the USB device, and a third port connected to the second expansion module.

11. The method of claim 10, wherein the second expansion module comprises:
    a voltage bus;
    a USB device; and
    a multi-port hub having a first port connected to the third port of the multi-port hub of the first expansion module, a second port connected to the USB device, and a third port connected to a third expansion module having a voltage bus.

12. The method of claim 11, further comprising connecting the third expansion module comprises:
    a USB device; and
    a multi-port hub having a first port connected to the third port of the multi-port hub of the second expansion module, a second port connected to the USB device, and a third port.

13. The method of claim 12, wherein USB devices of the first, second, and third expansion modules are selected from a group consisting of microprocessors, converters, amplifiers, databases and memories.

14. The method of claim 12, further comprising:
    connecting the voltage bus of the first expansion module to a power source at the baseboard;
    connecting the multi-port hub and USB device of the first expansion module to the voltage bus of the first expansion module;

connecting the multi-port hub and USB device of the second expansion module to the voltage bus of the second expansion module;

connecting the multi-port hub and USB device of the third expansion module to the voltage bus of the third expansion module;

connecting the voltage bus of the second expansion module to the voltage bus of the first expansion module; and connecting the voltage bus of the third expansion module to the voltage bus of the second expansion module.

15. The method of claim 11, further comprising connecting a third expansion module of one or more of N additional expansion modules to the second expansion module, a N−2 expansion module of the one or more of N additional expansion modules to the third expansion module, an N−3 expansion module of the one or more of N additional expansion modules to the N−2 expansion module, an N−4 expansion module of the one or more of N additional expansion modules to the N−3 expansion module, and so on in a daisy chain fashion through connecting an N−(N−1) expansion module to an N−(N−2) expansion module, in a manner that the second expansion module is connected to the first expansion module, wherein each expansion module of the one or more of N additional expansion modules comprises:
a voltage bus;
a USB device; and
a multi-port hub.

16. An expansion bus mechanism comprising:
a baseboard comprising:
a power source;
a controller;
an expansion connector connected to the controller; and is free of a USB hub; and
a daisy chain of a number (N) of expansion modules having a first expansion module connected to the expansion connector; and wherein:
each expansion module of the N expansion modules comprises:
a multi-port hub;
one or more devices connected to the multi-port hub;
a voltage bus; and
a voltage regulator having an input connected to the voltage bus and an output connected to the multi-port hub and to one or more devices;
the voltage bus of the first expansion module of the N expansion modules is connected to the power source;
each of the second through N expansion modules has a first port of its multiport hub connected to a preceding expansion module, a second port connected to a first port of a succeeding expansion module;
the voltage bus of each of the second through N expansion modules is connected to the voltage bus of the preceding expansion module;
a preceding expansion module is an n−1 expansion module and a succeeding expansion module is an n+1 expansion module of an n module;
an n module is any module selected from the second through N−1 expansion modules; and
an Nth expansion module has a preceding (N−1) expansion module.

17. The expansion bus mechanism of claim 16, wherein the multi-port hub of each of the N expansion modules has a third port connected to a device.

18. The expansion bus mechanism of claim 17, wherein one or more devices are selected from a group consisting of microprocessors, converters, amplifiers, databases and memories.

19. The expansion bus mechanism of claim 16, wherein:
the multi-port hub is a universal serial bus (USB) hub; and
the one or more devices are USB devices.

20. The expansion bus mechanism of claim 16, wherein the power source is a voltage regulated power source.

* * * * *